United States Patent
Yang et al.

(10) Patent No.: US 8,271,854 B2
(45) Date of Patent: Sep. 18, 2012

(54) EMBEDDED ELECTRONIC DEVICE AND METHOD FOR STORING DATA

(75) Inventors: Yao-Kun Yang, Taipei Hsien (TW); Po-Chih Lin, Taipei Hsien (TW)

(73) Assignee: Wistron Corp., New Taipei (TW)

( * ) Notice: Subject to any disclaimer, the term of this patent is extended or adjusted under 35 U.S.C. 154(b) by 637 days.

(21) Appl. No.: 12/485,740

(22) Filed: Jun. 16, 2009

(65) Prior Publication Data
US 2010/0229068 A1 Sep. 9, 2010

(30) Foreign Application Priority Data
Mar. 3, 2009 (TW) .............................. 98106805 A

(51) Int. Cl.
*H03M 13/00* (2006.01)
(52) U.S. Cl. .................... 714/763; 714/773; 714/801
(58) Field of Classification Search .................. 714/763, 714/773, 795, 782, 718, 801, 785
See application file for complete search history.

(56) References Cited

U.S. PATENT DOCUMENTS

| | | | |
|---|---|---|---|
| 5,680,579 A * | 10/1997 | Young et al. | 711/157 |
| 5,956,743 A * | 9/1999 | Bruce et al. | 711/103 |
| 6,728,826 B2 * | 4/2004 | Kaki et al. | 711/103 |
| 2005/0091569 A1 | 4/2005 | Chao | |

FOREIGN PATENT DOCUMENTS

KR 10-0735774 7/2007

* cited by examiner

*Primary Examiner* — Fritz Alphonse

(57) ABSTRACT

An embedded electronic device is provided. The embedded electronic device comprises a flash memory and a processor. The flash memory comprises a plurality of data storage blocks. The processor performs a parity check process to determine parity data of operation system (OS) data, wherein the parity data serves as a backup for the operation system (OS) data. The processor stores the operation system (OS) data and corresponding parity data into the data storage block of the flash memory.

12 Claims, 9 Drawing Sheets

EMBEDDED ELECTRONIC DEVICE AND METHOD FOR STORING DATA

CROSS REFERENCE TO RELATED APPLICATIONS

This Application claims priority of Taiwan Patent Application No. 98106805, the entirety of which is incorporated by reference herein.

BACKGROUND

The invention relates to a fault tolerant data storing method implemented in a NAND-Flash memory.

Many embedded systems have memory systems consisting of read-only memory and random access memory (ROM+RAM). The random access memory has high access performance, and is therefore used as working memory for an operation system or program execution. Nevertheless, information stored in RAM is lost after a power is switched off. Read-only memory is thus used for storing the operation system software and other important information. NAND-Flash or NOR-Flash is generally used as a storage mechanism for Read-only memory, such as a hard disk in a computer.

For an embedded system, three parts of information is stored in NAND-Flash, i.e., (1) bootstrap information (Nboot); (2) operation system information (OS); and (3) user information (free space).

When a system is initiated, a CPU retrieves Nboot from a Flash, and loads and executes the retrieved Nboot in a RAM. Similar to BIOS in a computer, Nboot directs system initialization, retrieves operation system software from flash, loads and executes the operation system software in RAM, and performs a boot process accordingly.

A conventional embedded system has the following disadvantages. Before a device equipped with an embedded system leaves the factory, Nboot information and OS information has been stored in Flash memory of the device. The Nboot and OS information is written into Flash using JTAG or an external Flash writer. Using JTAG for writing data is time consuming. Accordingly, an external Flash writer is generally used for writing data into Flash. Among blocks in a Flash memory, only block 0 is guaranteed to be fault-free. Accordingly, when a bad block exists among the blocks storing OS information and the Flash writer fails to handle this bad block, the OS information cannot be written into Flash correctly. Accordingly, the operation system cannot initiate properly because of the bad block. Under this circumstance, it takes time to re-write correct data into Flash of the device via a USB device of a computer.

SUMMARY

Certain aspects commensurate in scope with the originally claimed invention are set forth below. It should be understood that these aspects are presented merely to provide the reader with a brief summary of certain forms the invention might take and that these aspects are not intended to limit the scope of the invention. Indeed, the invention may encompass a variety of aspects that may not be set forth below.

An embedded electronic device is provided. The embedded electronic device comprises a flash memory and a processor. The flash memory comprises a plurality of data storage blocks. The processor divides operation system data into a plurality of data block sets, each of which comprises at least one data block, and data amount stored in the data block equals to data amount stored in the data storage block. The processor performs a parity check process on the data blocks within each of the data block sets to generate parity data of the corresponding data block, and the parity data is used as backup for the operation system data. The processor further stores the operation system data and corresponding parity data into the data storage block of the flash memory.

Also provided is a method for storing data. The method is implemented in an embedded electronic device equipped with a flash memory, wherein the flash memory comprises a plurality of data storage blocks. Operation system data is first provided, wherein the operation system data comprises a plurality of data block sets, each of which comprises at least one data block, and data amount stored in the data block equals to data amount stored in the data storage block. A parity check process is performed on the data blocks within each of the data block sets to generate parity data of the corresponding data block, wherein the parity data is used as backup for the operation system data. The operation system data and the parity data are stored into the data storage block of the flash memory.

BRIEF DESCRIPTION OF DRAWINGS

The invention can be more fully understood by reading the subsequent detailed description and examples with references made to the accompanying drawings, wherein.

DETAILED DESCRIPTION

One or more specific embodiments of the invention are described below. In an effort to provide a concise description of these embodiments, not all features of an actual implementation are described in the specification. It should be appreciated that in the development of any such actual implementation, as in any engineering or design project, numerous implementation-specific decisions must be made to achieve specific developer goals, such as compliance with system-related and business-related constraints, which may vary from one implementation process to another. Moreover, it should be appreciated that such a development effort might be complex and time consuming, but would nevertheless be a routine undertaking of design, fabrication, and manufacture for those of ordinary skill having the benefit of this disclosure.

In the following detailed description, reference is made to the accompanying drawings which form a part hereof, shown by way of illustration of specific embodiments. These embodiments are described in sufficient detail to enable those skilled in the art to practice the invention, and it is to be understood that other embodiments may be utilized and that structural, logical and electrical changes may be made without departing from the spirit and scope of the invention. The following detailed description is, therefore, not to be taken in a limiting sense. The leading digit(s) of reference numbers appearing in the figures corresponds to the figure number, with the exception that the same reference number is used throughout to refer to an identical component which appears in multiple figures. It should be understood that the many of the elements described and illustrated throughout the specification are functional in nature and may be embodied in one or more physical entities or may take other forms beyond those described or depicted.

Here, embodiments of the invention are described referring to accompanying drawings. According to the embodiments, parity data of operation system data is generated by performing a parity check. The parity data can be used as a backup for data stored in a damaged storage block. The parity data is used to restore operation system data stored in a damaged storage block in a flash memory. The restored operation system data is then loaded into random access memory and executed during a system initiation process.

Figure 1:
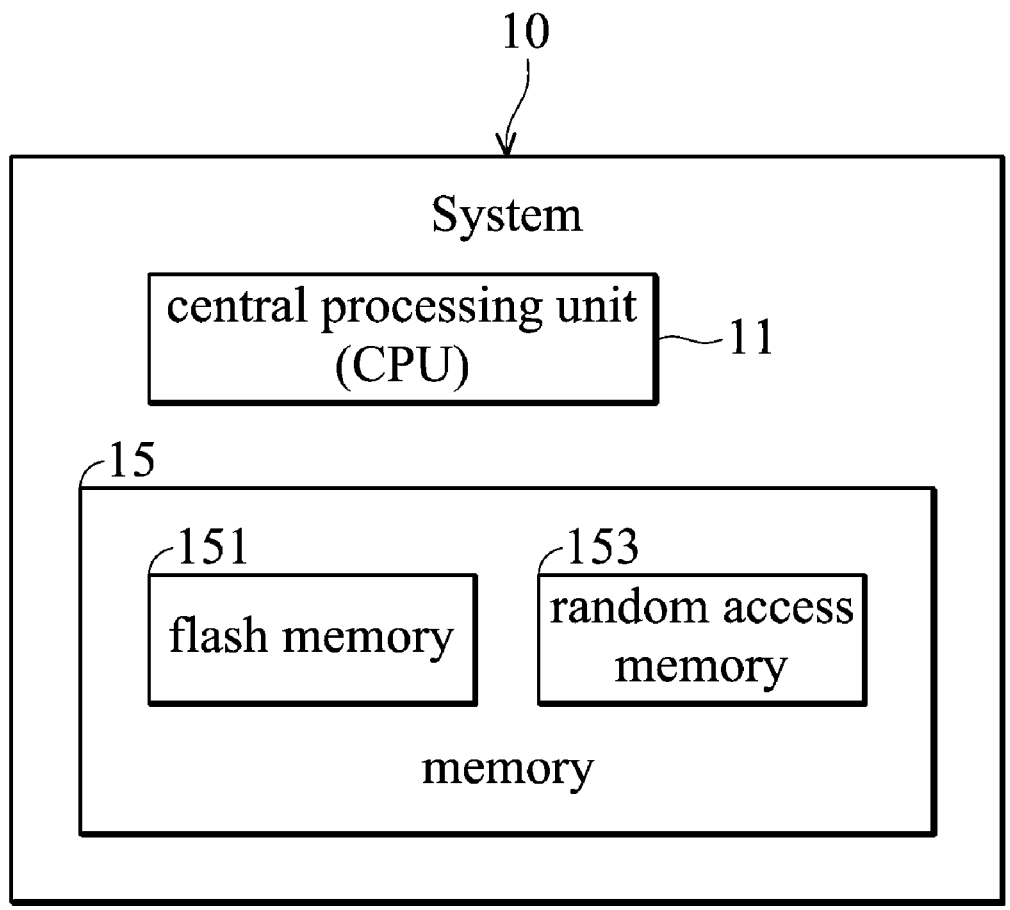
FIG. 1 illustrates a block diagram of an embodiment of an embedded electronic device.

FIG. 1 illustrates a block diagram of an exemplary system. System 10 is an embedded electronic device, comprising various components corresponding to function and property thereof. In this embodiment, relevant components comprise: a central processing unit (CPU) 11 and a memory 15. The memory 15 comprises a flash memory 151 and a random access memory 153. Here, the flash memory 151 is a NAND flash.

Figure 2:
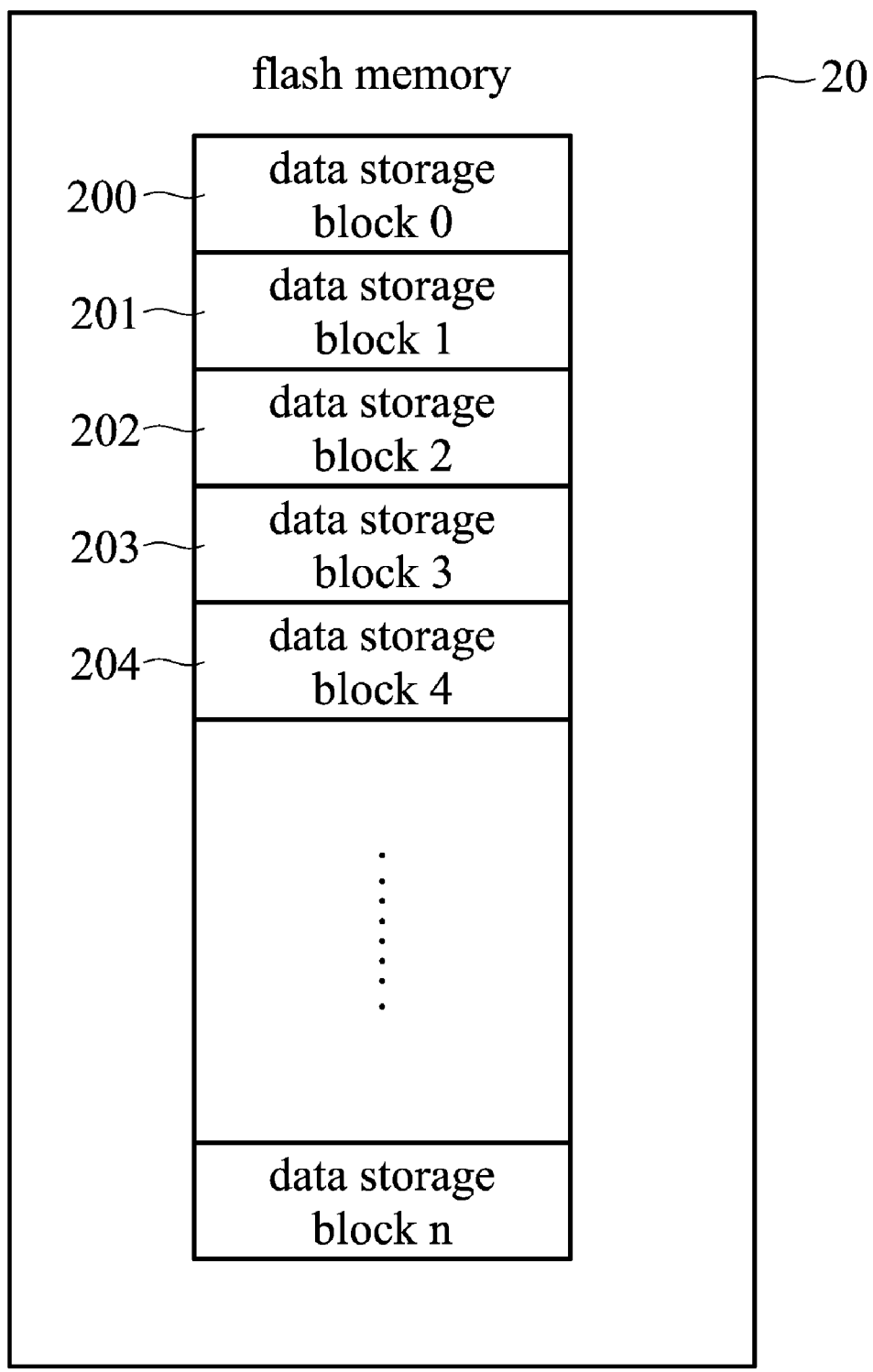
FIG. 2 illustrates a schematic view of data storage architecture in the flash memory of FIG. 1.

FIG. 2 illustrates a schematic view of data storage architecture in the flash memory of FIG. 1. As described, a NAND flash is adopted here. The flash memory stores data in data storage blocks. Capacity of a data storage block varies in different flash memories. Referring to FIG. 2, a flash memory 20 comprises a plurality of data storage blocks, such as data storage block 0 (200), data storage block 1 (201), data storage block 2 (202), data storage block 3 (203), and data storage block 4 (204).

Figure 3:
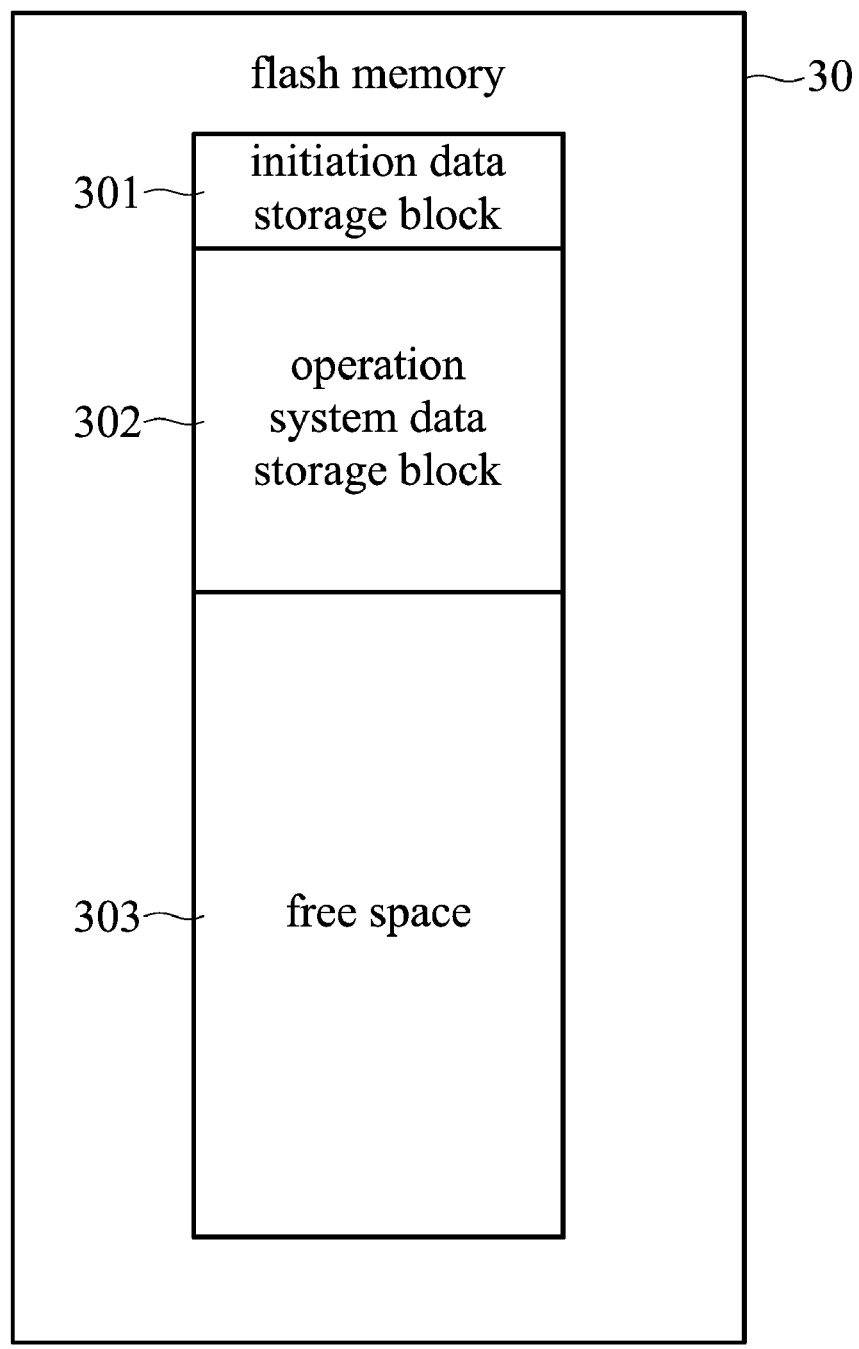
FIG. 3 illustrates data storage arrangement in a flash memory.

FIG. 3 illustrates data storage arrangement in a flash memory. As shown in FIG. 3, in a flash memory 30, system data is stored from block 0 sequentially. The block 0 is the first data storage block in the flash memory 30, and is the initiation data storage block 301 for storing NBoot data. Operation system data is stored in the operation system data storage block 302 in succession from the initiation data storage block 301. The remaining storage blocks are available for the users as free space 303.

Generally, among data storage blocks in a Flash memory, only data storage block 0, i.e., initiation data storage block 301 for storing NBoot data, is guaranteed to be fault-free. Data storage blocks other than block 0, such as the operation system data storage block 302 might contain errors.

Figure 4:
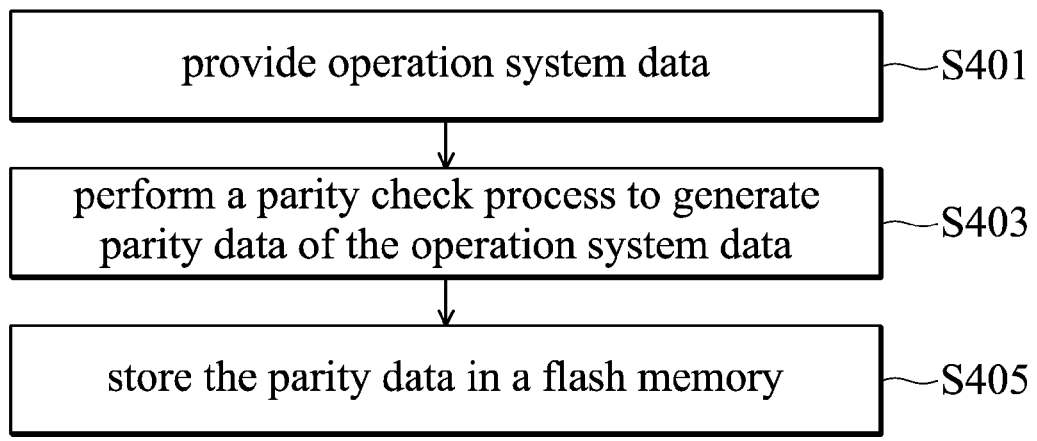
FIG. 4 is a flowchart of an embodiment of a method for storing data.

FIG. 4 is a flowchart of an embodiment of a method for storing data. The method of FIG. 4 can be implemented in the systems shown in FIG. 1 and FIG. 2, and the stored data are arranged according to the data storage arrangement in a flash memory shown in FIG. 3.

In step S401, operation system data is provided.

In step S403, a parity check process is performed to generate parity data of the operation system data provided in step S401. The parity data is used as a backup for the operation system data, and can be used to restore the operation system data stored in damaged storage block.

In order to generate the backup of the operation system data provided in step S401, operation system data is divided into several parts, and the number of data blocks within each of the data block sets is determined according to the following equation.

$$N=[(A/B)]$$

In this equation, N represents an integer, and is a number of data blocks within the data block set; A is a number of data blocks consisting of the operation system data; and B is a number of data storage blocks available for storing the parity data.

In a certain data block set, only data stored in one of the data blocks can be correctly restored. Accordingly, when there are two or more damaged data blocks in a data block set, the restoration cannot be correctly performed. As a result, fault tolerance increases when the number of data blocks within a data block set decreases.

In this embodiment, there are 3 data blocks within a data block set, and each of the data blocks is capable of storing 8 bits of data.

In this embodiment, an XOR calculation is performed on data stored in each of the data blocks within each of the data block sets to generate the parity data for the corresponding data block set. The parity data of a certain data block set has the same data bits with any one of the data blocks within the very data block set.

For example, there are 3 data blocks within a data block set, and each of the data blocks has 8 bits of data:

Data block 1 (D1)=10100101;
Data block 2 (D2)=11110000; and
Data block 3 (D3)=00111100.

The parity data (P) corresponding to this data block set is as the following:

$$\begin{aligned} P &= (D1) XOR(D2) XOR(D3) \\ &= ((D1 \ XOR \ D2) \ XOR \ D3) \\ &= ((10100101 \ XOR \ 11110000) \ XOR \ 00111100) \\ &= (01010101) \ XOR \ (00111100) \\ &= 01101001. \end{aligned}$$

In step S405, the parity data generated in step S403 is stored in a flash memory.

Figure 5:
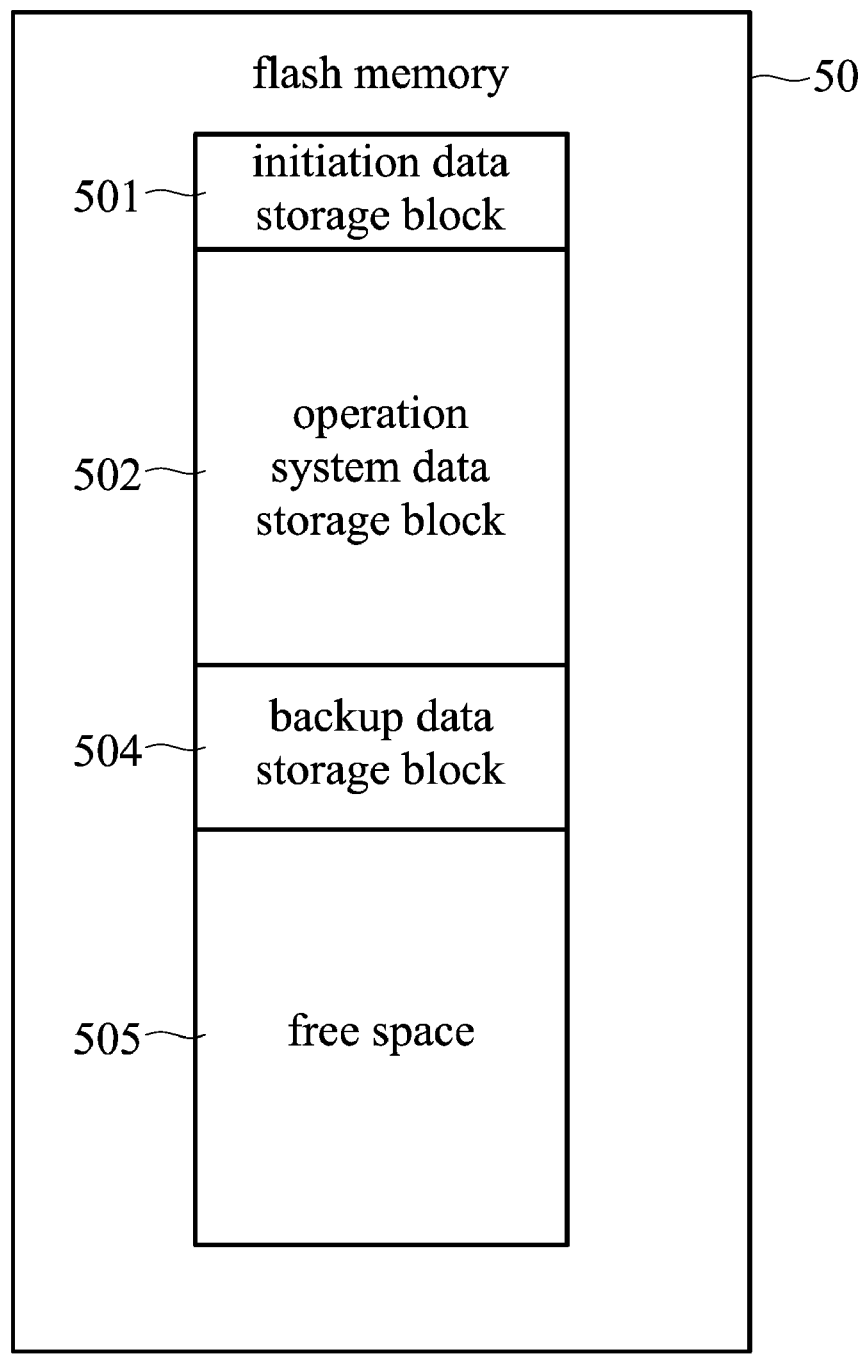
FIG. 5 illustrates data storage arrangement in a flash memory.

In this embodiment, an area of the free space is reserved for the parity data of the operation system data, as shown in FIG. 5.

FIG. 5 illustrates data storage arrangement in a flash memory. Comparing FIG. 5 and FIG. 3, FIG. 3 shows the data storage arrangement before the backup of the operation system data (i.e., the parity data of the operation system data) is loaded in, and FIG. 5 shows the data storage arrangement when backup of the operation system data (i.e., the parity data of the operation system data) is being loaded in. Referring to FIG. 5, the block 0 is the first data storage block in the flash memory 50, and is initiation data storage block 501 for storing NBoot data. Operation system data is stored in the operation system data storage block 502 in succession from the initiation data storage block 501. The parity data corresponding to the operation system data is stored in succession to the operation system data storage block 502, i.e., in the backup data storage block 504. The remaining storage blocks are available for the users as free space 505.

Figure 6:
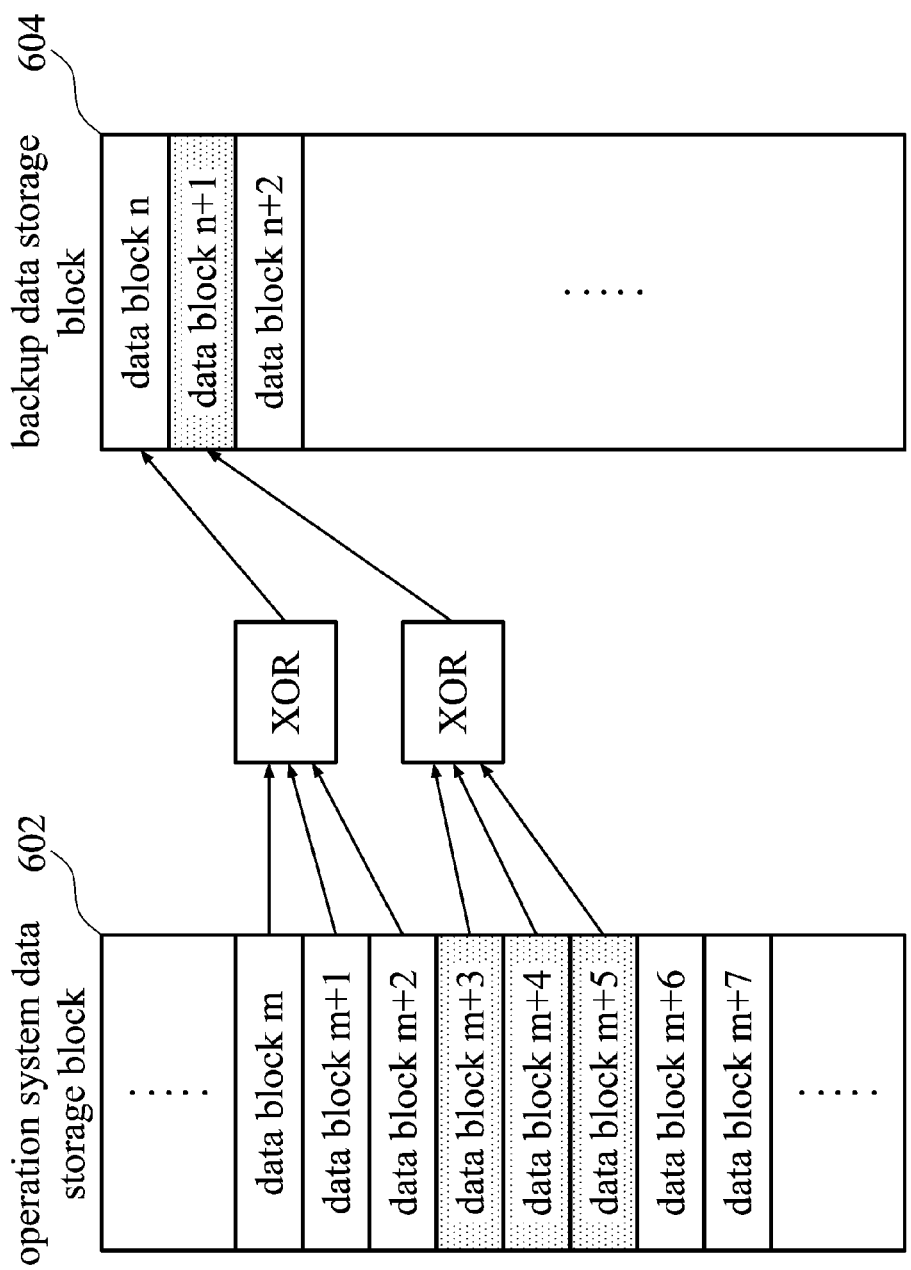
FIG. 6 illustrates relationship between operation system data and corresponding parity data.

More specifically, the operation system data is stored in the $m^{th}$ data block and the following data blocks, the corresponding parity data is stored in the $n^{th}$ data block and the following data blocks. The correspondence between the operation system data and the parity data is shown in FIG. 6. In the operation system data storage block 602, every 3 data blocks are grouped as a data block set, and every data block set corresponds to a data block in the backup data storage block 604.

Accordingly, parity data for each of the data block set is generated according to the preset equations, such as the followings:

parity data ($n^{th}$ data block)=operation system data ($m^{th}$ data block) XOR operation system data (($m+1)^{th}$ data block) XOR operation system data (($m+2)^{th}$ data block)

parity data (($n+1)^{th}$ data block)=operation system data (($m+3)^{th}$ data block) XOR operation system data (($m+4)^{th}$ data block) XOR operation system data (($m+5)^{th}$ data block).

The parity data is then stored according to predetermined settings, and can be used as a backup for the operation system data.

When damages occur in data storage blocks storing the operation system data, the backup for the operation system data can be used for restoring the operation system data.

Figure 7:
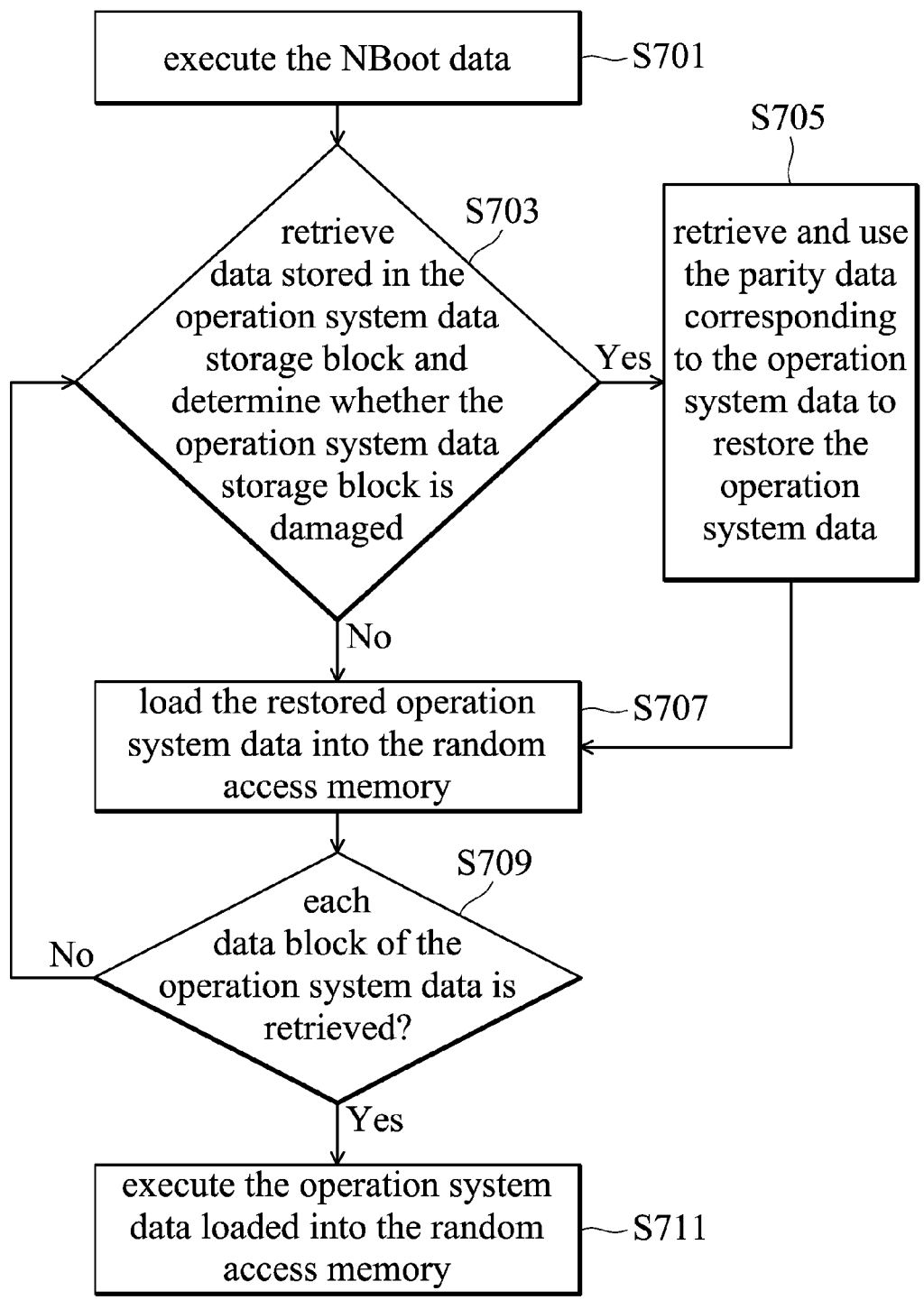
FIG. 7 is a flowchart of an embodiment of restoring operation system data using a backup.

FIG. 7 is a flowchart of an embodiment of restoring operation system data using a backup.

In step S701, the NBoot data stored in the initiation data storage block is executed.

In step S703, data stored in the operation system data storage block of the flash memory is retrieved. In addition, it is determined whether the operation system data storage block is damaged, and if so, the method proceeds to step S705, otherwise, the method proceeds to step S707.

In step S705, the parity data corresponding to the operation system data stored in the damaged operation system data storage block is retrieved and used to restore the operation system data.

As described in step S403, an XOR calculation is performed on data stored in each of the data blocks within each of the data block sets to generate the parity data for the corresponding data block set. Accordingly, if any one of the data block is damaged, the parity data P can be used in XOR calculation to restore data stored in the damaged data block. For example, referring to the described example, if the data block 2 (D2) is damaged, the data stored therein can be restored as the following:

$$\begin{aligned} D2 &= (D1) \; XOR \; (D3) \; XOR \; (\text{parity data } P) \\ &= ((D1) \; XOR \; (D3)) \; XOR \; (\text{parity data } P) \\ &= (((10100101) \; XOR \; (00111100)) \; XOR \; 01101001) \\ &= (10011001) \; XOR \; (01101001) \\ &= 11110000. \end{aligned}$$

Figure 8:
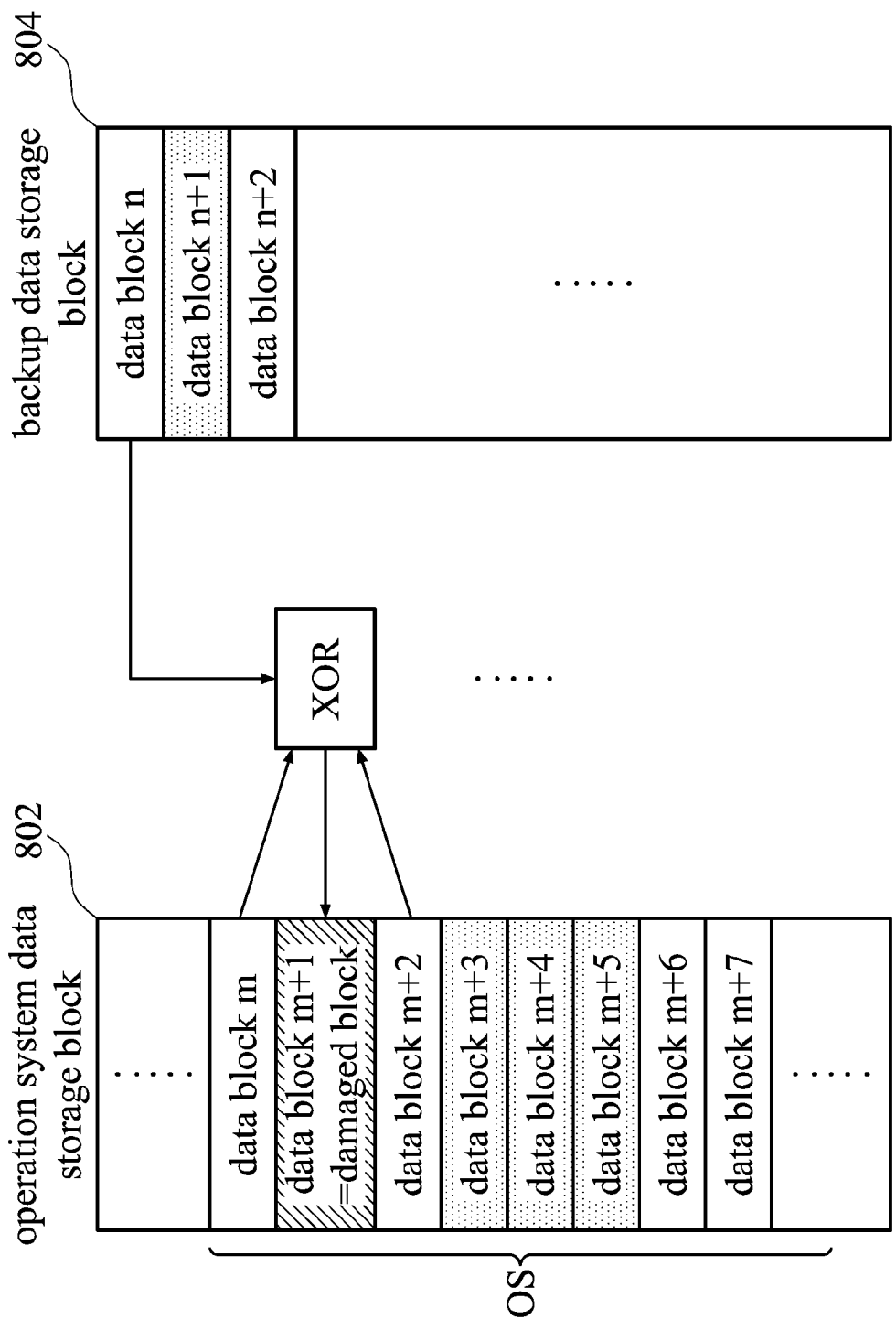
FIG. 8 illustrates relationship between backup data and stored operation system data.

FIG. 8 illustrates relationship between backup data and stored operation system data in step S705. Referring to FIG. 8, for the operation system data storage block 802, every 3 data blocks are grouped as a data block set, and every data block set corresponds to a data block in the backup data storage block 804. As shown in FIG. 8, when $(m+1)^{th}$ data block within the operation system data storage block is damaged, an XOR calculation is performed to restore data stored in the $(m+1)^{th}$ data block.

In step S707, the restored operation system data or the original operation system data (if no damage has occurred) is loaded into the random access memory.

In step S709, it is determined whether each data block of the operation system data is retrieved, and if so, the method proceeds to step S711, otherwise, the method returns to step S703.

In step S711, the operation system data (program codes) loaded into the random access memory is executed.

Figure 9:
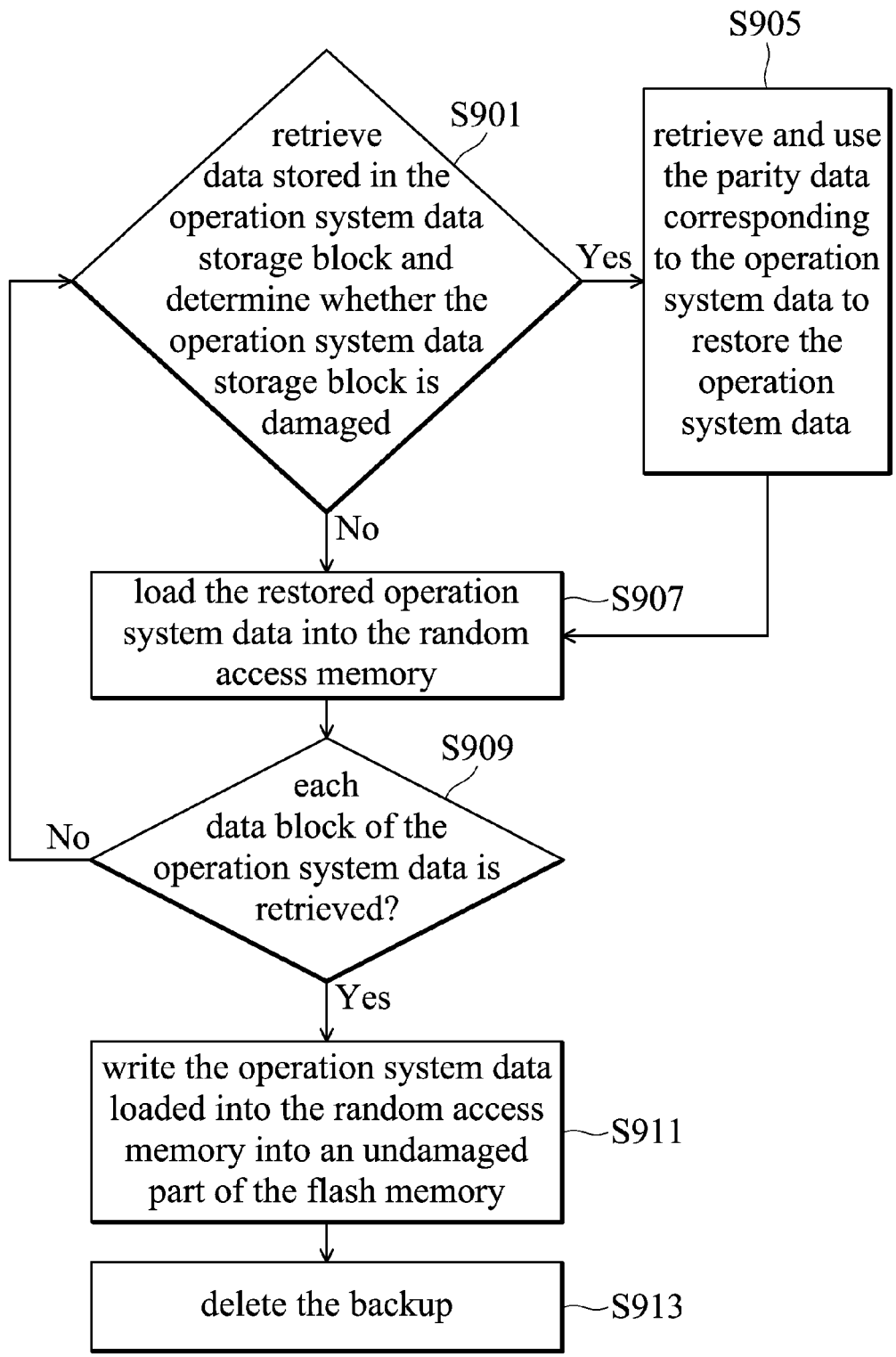
FIG. 9 is a flowchart of another embodiment of restoring operation system data using a backup.

FIG. 9 is a flowchart of another embodiment of restoring operation system data using a backup.

In step S901, data stored in the operation system data storage block of the flash memory is retrieved. In addition, it is determined whether the operation system data storage block is damaged. If so, the method proceeds to step S905, otherwise, the method proceeds to step S907.

In step S905, the parity data corresponding to the operation system data stored in the damaged operation system data storage block is retrieved and used to restore the operation system data. Details of the restoration process can be understood by referring to the description of step S705.

In step S907, the restored operation system data is loaded into the random access memory.

In step S909, it is determined whether each data block of the operation system data is retrieved, and if so, the method proceeds to step S911, otherwise, the method returns to step S903.

In step S911, the operation system data loaded into the random access memory (i.e., correct operation system data) is written into an undamaged part of the flash memory.

In step S913, the backup is deleted.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device, comprising:
    a flash memory, comprising a plurality of data storage blocks;
    a random access memory; and
    a processor, wherein:
    the processor divides operation system data into a plurality of data block sets, each of which comprises at least one data block, and data amount stored in the data block equals to data amount stored in the data storage block;
    the processor performs a parity check process on the data blocks within each of the data block sets to generate parity data of the corresponding data block, and the parity data is used as backup for the operation system data; and
    the processor stores the operation system data and the parity data into the data storage block of the flash memory, wherein the processor further performs the following steps when executing the operation system data:
      determining whether the flash memory is damaged in the data storage block storing the operation system data;
      when the flash memory is damaged in the data storage block storing the operation system data, retrieving the parity data corresponding to the data block of the operation system data stored in the damaged data storage block;
      restoring operation system data that is meant to be stored in the damaged data storage block according to the retrieved parity data; and loading the restored operation system data into the random access memory.

2. The electronic device of claim 1, wherein the processor further determines a number of data blocks within each of the data block sets according to the following equation:

$$N=[(A/B)],$$

wherein N, an integer, is a number of data blocks within the data block set, A is a number of data blocks consisting of the operation system data, and B is a number of data storage blocks available for storing the parity data.

3. The electronic device of claim 1, wherein the processor further performs XOR calculation on data stored in each of the data blocks within each of the data block sets to generate the parity data for the corresponding data block set.

4. The electronic device of claim 1, wherein the processor further executes the restored operation system data loaded into the random access memory.

5. The electronic device of claim 1, wherein the processor further rewrites the restored operation system data loaded into the random access memory into undamaged data storage blocks within the flash memory to repair the operation system data stored in the damaged data storage block.

6. The electronic device of claim 5, wherein the processor further deletes the parity data after the operation system data loaded into the random access memory has been rewritten into the flash memory.

7. A method for storing data, implemented in an embedded electronic device equipped with a flash memory and a random access memory, wherein the flash memory comprises a plurality of data storage blocks, comprising:
- providing operation system data, wherein the operation system data comprises a plurality of data block sets, each of which comprises at least one data block, and data amount stored in the data block equals to data amount stored in the data storage block;
- performing a parity check process on the data blocks within each of the data block sets to generate parity data of the corresponding data block, wherein the parity data is used as a backup for the operation system data;
- storing the operation system data and the parity data into the data storage block of the flash memory; and
- executing the operation system data, wherein the method further performs the following steps when executing the operation system data:
  - determining whether the flash memory is damaged in the data storage block storing the operation system data;
  - if the flash memory is damaged in the data storage block storing the operation system data, retrieving the parity data corresponding to the data block of the operation system data stored in the damaged data storage block;
  - restoring operation system data that is meant to be stored in the damaged data storage block according to the retrieved parity data; and
  - loading the restored operation system data into the random access memory.

8. The method of claim 7, further determining a number of data blocks within each of the data block sets according to the following equation:

$$N=[(A/B)],$$

wherein N, an integer, is a number of data blocks within the data block set; A is a number of data blocks consisting of the operation system data; and B is a number of data storage blocks available for storing the parity data.

9. The method of claim 7, further performing XOR calculation on data stored in each of the data blocks within each of the data block sets to generate the parity data for the corresponding data block set.

10. The method of claim 7, further executing the restored operation system data loaded into the random access memory.

11. The method of claim 7, further rewriting the restored operation system data loaded into the random access memory into undamaged data storage blocks within the flash memory to repair the operation system data stored in the damaged data storage block.

12. The method of claim 11, further deleting the parity data after the operation system data loaded into the random access memory has been rewritten into the flash memory.

* * * * *